United States Patent
Lee et al.

(10) Patent No.: US 12,012,535 B2
(45) Date of Patent: *Jun. 18, 2024

(54) ADHESIVE COMPOSITION, ADHESIVE FILM COMPRISING SAME, BACKPLATE FILM COMPRISING ADHESIVE FILM, AND PLASTIC ORGANIC LIGHT EMITTING DISPLAY COMPRISING ADHESIVE FILM

(71) Applicant: LG Chem, Ltd., Seoul (KR)

(72) Inventors: Hui Je Lee, Daejeon (KR); Yoonkyung Kwon, Daejeon (KR); Byungsu Park, Daejeon (KR); Seongwook Kang, Daejeon (KR); Sanghun Han, Daejeon (KR)

(73) Assignee: LG Chem, Ltd., Seoul (KR)

( * ) Notice: Subject to any disclaimer, the term of this patent is extended or adjusted under 35 U.S.C. 154(b) by 567 days.

This patent is subject to a terminal disclaimer.

(21) Appl. No.: 17/259,730

(22) PCT Filed: Jul. 29, 2019

(86) PCT No.: PCT/KR2019/009431
§ 371 (c)(1),
(2) Date: Jan. 12, 2021

(87) PCT Pub. No.: WO2020/022867
PCT Pub. Date: Jan. 30, 2020

(65) Prior Publication Data
US 2021/0284876 A1    Sep. 16, 2021

(30) Foreign Application Priority Data

Jul. 27, 2018 (KR) .................. 10-2018-0087785

(51) Int. Cl.
*C09J 183/10* (2006.01)
*B32B 7/12* (2006.01)
(Continued)

(52) U.S. Cl.
CPC .............. *C09J 7/385* (2018.01); *B32B 7/12* (2013.01); *C08F 220/1818* (2020.02);
(Continued)

(58) Field of Classification Search
None
See application file for complete search history.

(56) References Cited

U.S. PATENT DOCUMENTS 5,814,685 A * 9/1998 Satake ................ C09D 11/326
525/902
6,524,675 B1   2/2003 Mikami et al.
(Continued)

FOREIGN PATENT DOCUMENTS

CN   103682148 A   3/2014
CN   105121587 A   12/2015
(Continued)

OTHER PUBLICATIONS

Machine translation of JP 2015178539 A (Year: 2015).*
(Continued)

*Primary Examiner* — Frank D Ducheneaux
(74) *Attorney, Agent, or Firm* — Lerner David LLP

(57) ABSTRACT

An adhesive composition, an adhesive film comprising the same, a backplate film comprising the adhesive film, and a plastic organic light emitting display comprising the adhesive film are provided. The adhesive composition includes a (meth)acrylate-based resin, and a polymer having a melting temperature (Tm) of 53° C. or higher, wherein the polymer is a copolymer of a monofunctional polysiloxane and one type of monomer.

12 Claims, 3 Drawing Sheets

(51) Int. Cl.

| | | |
|---|---|---|
| C08F 220/18 | (2006.01) | |
| C08L 51/08 | (2006.01) | |
| C08L 83/04 | (2006.01) | |
| C09J 7/20 | (2018.01) | |
| C09J 7/25 | (2018.01) | |
| C09J 7/38 | (2018.01) | |
| C09J 7/40 | (2018.01) | |
| C09J 133/06 | (2006.01) | |
| C09J 133/08 | (2006.01) | |
| C09J 133/10 | (2006.01) | |
| C09J 133/14 | (2006.01) | |
| C09J 183/04 | (2006.01) | |
| C09J 183/06 | (2006.01) | |
| H10K 77/10 | (2023.01) | |
| H10K 85/10 | (2023.01) | |
| H10K 85/40 | (2023.01) | |
| H10K 102/00 | (2023.01) | |

(52) U.S. Cl.
CPC ............ *C08L 51/085* (2013.01); *C08L 83/04* (2013.01); *C09J 7/20* (2018.01); *C09J 7/255* (2018.01); *C09J 7/40* (2018.01); *C09J 133/066* (2013.01); *C09J 133/08* (2013.01); *C09J 133/10* (2013.01); *C09J 133/14* (2013.01); *C09J 183/04* (2013.01); *C09J 183/06* (2013.01); *C09J 183/10* (2013.01); *H10K 77/111* (2023.02); *H10K 85/141* (2023.02); *H10K 85/151* (2023.02); *H10K 85/40* (2023.02); *B32B 2255/26* (2013.01); *B32B 2457/206* (2013.01); *C09J 2203/318* (2013.01); *C09J 2301/312* (2020.08); *C09J 2400/226* (2013.01); *C09J 2433/00* (2013.01); *C09J 2467/006* (2013.01); *C09J 2483/00* (2013.01); *H10K 2102/311* (2023.02)

(56) References Cited

U.S. PATENT DOCUMENTS

| | | | |
|---|---|---|---|
| 7,070,051 B2 * | 7/2006 | Kanner ............ | A61B 17/06133 206/460 |
| 8,664,329 B2 | 3/2014 | Liu | |
| 10,658,626 B2 | 5/2020 | Mun et al. | |
| 10,738,221 B2 | 8/2020 | Shigetomi et al. | |
| 10,792,902 B2 * | 10/2020 | Kanno ................... | B32B 27/16 |
| 10,815,396 B2 | 10/2020 | Suzuki et al. | |
| 2003/0178124 A1 | 9/2003 | Mikami et al. | |
| 2006/0159915 A1 | 7/2006 | Chang et al. | |
| 2010/0101723 A1 | 4/2010 | Okamoto et al. | |
| 2012/0114737 A1 | 5/2012 | Loubert et al. | |
| 2013/0012653 A1 | 1/2013 | Liu | |
| 2014/0061610 A1 | 3/2014 | Mun et al. | |
| 2016/0032154 A1 | 2/2016 | Kanno et al. | |
| 2017/0043566 A1 | 2/2017 | Kanno et al. | |
| 2017/0081557 A1 | 3/2017 | Shigetomi et al. | |
| 2017/0306184 A1 | 10/2017 | Nakayama et al. | |
| 2019/0127611 A1 | 5/2019 | Suzuki et al. | |
| 2019/0194499 A1 | 6/2019 | Kanno et al. | |
| 2020/0377765 A1 | 12/2020 | Kang et al. | |
| 2021/0087435 A1 | 3/2021 | Kang et al. | |
| 2021/0115304 A1 | 4/2021 | Park et al. | |
| 2021/0277298 A1 | 9/2021 | Park et al. | |
| 2021/0284876 A1 | 9/2021 | Lee et al. | |
| 2021/0371713 A1 | 12/2021 | Nam et al. | |

FOREIGN PATENT DOCUMENTS

| | | | | |
|---|---|---|---|---|
| CN | 105555895 A | 5/2016 | | |
| CN | 106103627 A | 11/2016 | | |
| CN | 106133011 A | 11/2016 | | |
| CN | 107075340 A | 8/2017 | | |
| EP | 3208324 A1 | 8/2017 | | |
| EP | 3480270 A1 | 5/2019 | | |
| EP | 3747969 A1 | 12/2020 | | |
| EP | 3750964 A1 | 12/2020 | | |
| EP | 3750965 A1 | 12/2020 | | |
| EP | 3812436 A1 | 4/2021 | | |
| EP | 3812437 A1 | 4/2021 | | |
| EP | 3812438 A1 | 4/2021 | | |
| EP | 3812439 A1 | 4/2021 | | |
| EP | 3812440 A1 | 4/2021 | | |
| JP | 2006299283 A | 11/2006 | | |
| JP | 2009067824 A | 4/2009 | | |
| JP | 2009102542 A | 5/2009 | | |
| JP | 2009120743 A | 6/2009 | | |
| JP | 2011219617 A | 11/2011 | | |
| JP | 2012158633 A | 8/2012 | | |
| JP | 5231775 B2 * | 7/2013 | | |
| JP | 201449441 A | 3/2014 | | |
| JP | 2015178539 A | 10/2015 | | |
| JP | 2017168430 A | 9/2017 | | |
| JP | 2017206595 A | 11/2017 | | |
| JP | 6496066 B1 * | 4/2019 | ............ | C09J 133/00 |
| JP | 2019085441 A | 6/2019 | | |
| JP | 2021514020 A | 6/2021 | | |
| JP | 2021514412 A | 6/2021 | | |
| JP | 2021514413 A | 6/2021 | | |
| JP | 2021530590 A | 11/2021 | | |
| JP | 2021530593 A | 11/2021 | | |
| KR | 20140029135 A | 3/2014 | | |
| KR | 20140074067 A | 6/2014 | | |
| KR | 20140141724 A | 12/2014 | | |
| KR | 20150039714 A | 4/2015 | | |
| KR | 20150143507 A | 12/2015 | | |
| KR | 20160127839 A | 11/2016 | | |
| KR | 20160134677 A | 11/2016 | | |
| KR | 20160142286 A | 12/2016 | | |
| KR | 20170068502 A | 6/2017 | | |
| KR | 101793956 B1 * | 11/2017 | ............ | C09J 133/08 |
| TW | 201538668 A | 10/2015 | | |
| TW | 201700691 A | 1/2017 | | |
| WO | 2015141294 A1 | 9/2015 | | |
| WO | WO-2015141294 A1 * | 9/2015 | ............ | C08F 220/18 |
| WO | 2015152006 A1 | 10/2015 | | |
| WO | 2015163115 A1 | 10/2015 | | |
| WO | 2015190441 A1 | 12/2015 | | |

OTHER PUBLICATIONS

Machine translation of KR 101793956 B1 (Year: 2017).*
Aldrich Data Sheet (Year: 2019).*
Machine translation of JP 6496066 B1 (Year: 2019).*
Machine translation of WO 2015/141294 A1 (Year: 2015).*
Machine translation of JP 2009067824 A (Year: 2009).*
Machine translation of JP 5231775 B2 (Year: 2013).*
Search report from International Application No. PCT/KR2019/009431, dated Oct. 29, 2019.
Extended European Search Report for Application No. 19839875.2 dated Jul. 23, 2021, 3 pages.
"Monomers" from TCI Chemicals, pp. 1-36, retrieved on Sep. 26, 2022 (Year: 2022).
"n-undecyl methacrylate", from Santa Cruz Biotechnology, retrieved on Sep. 26, 2022 (Year: 2022).
Chinese Search Report for Application No. 201980013744.8 dated Jun. 17, 2021, 2 pages.
European Search Report for Application No. 19841100.1 dated Jul. 19, 2021. 2 pgs.
European Search Report for U.S. Appl. No. 19/841,703 dated Jul. 15, 2021. 2 pgs.
Extended European Search Report for Application No. 19840224.0 dated Mar. 24, 2021, pp. 1-3.
Extended Search Report for Application No. 19839873.7 dated Jul. 21, 2021. 7 pgs.
International Search Report for Application No. PCT/KR2019/009416 mailed Oct. 29, 2019, 2 pages.
International Search Report for Application No. PCT/KR2019/009421 mailed Oct. 29, 2019, 2 pages.

(56) References Cited

OTHER PUBLICATIONS

International Search Report for Application No. PCT/KR2019/009423 mailed Oct. 29, 2019, 2 pages.
International Search report for PCT/KR2019/009425 mailed Oct. 29, 2019; 3 pages.
International Search Report for PCT/KR2019/009426, dated Oct. 29, 2019, 2 pages.
Japanese Office Action in Japanese Application No. 2020-543778 dated Aug. 10, 2021, 11 pgs.
Sako, Keiske et al., "Thermosensitive Adhesive Agent", English translation KR 1020160134677 A, Nov. 23, 2016 (Year: 2016).
Search report from International Application No. PCT/KR2019/009428, mailed Nov. 11, 2019.
Search report from International Application No. PCT/KR2019/009429, mailed Oct. 29, 2019.
Search report from Office Action Dated Mar. 13, 2020, from corresponding Taiwanese Application No. 108126740.
Search report from Office Action Dated Mar. 13, 2020, from corresponding Taiwanese Application No. 108126749.

\* cited by examiner

[FIG. 1]
[FIG. 2]
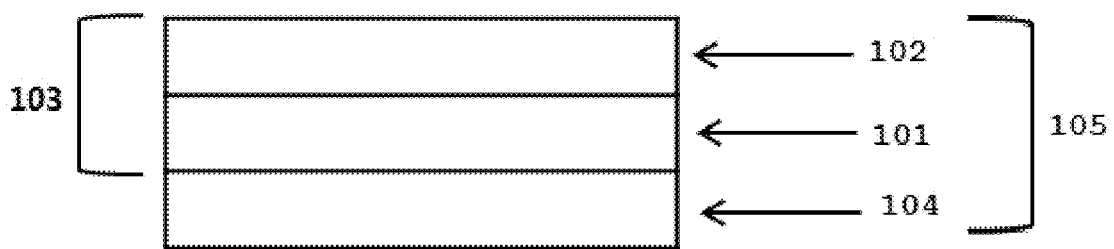
[FIG. 3]
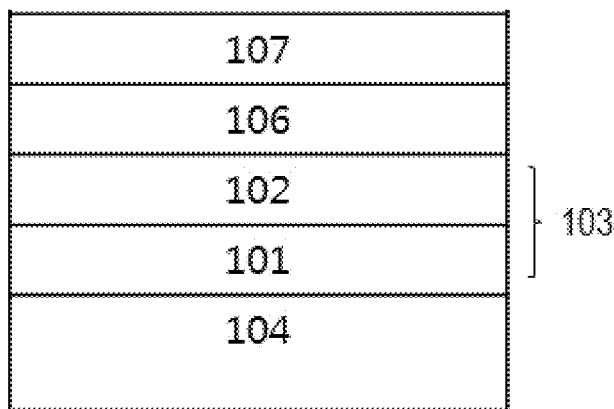

[FIG. 4]
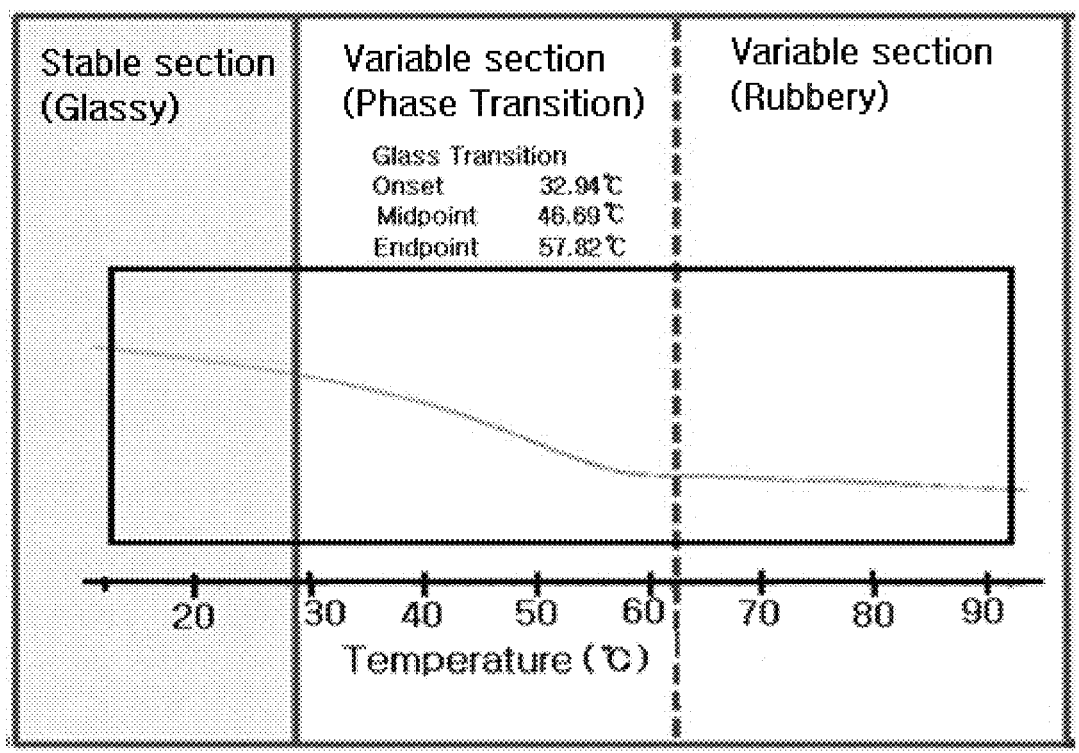

[FIG. 5]
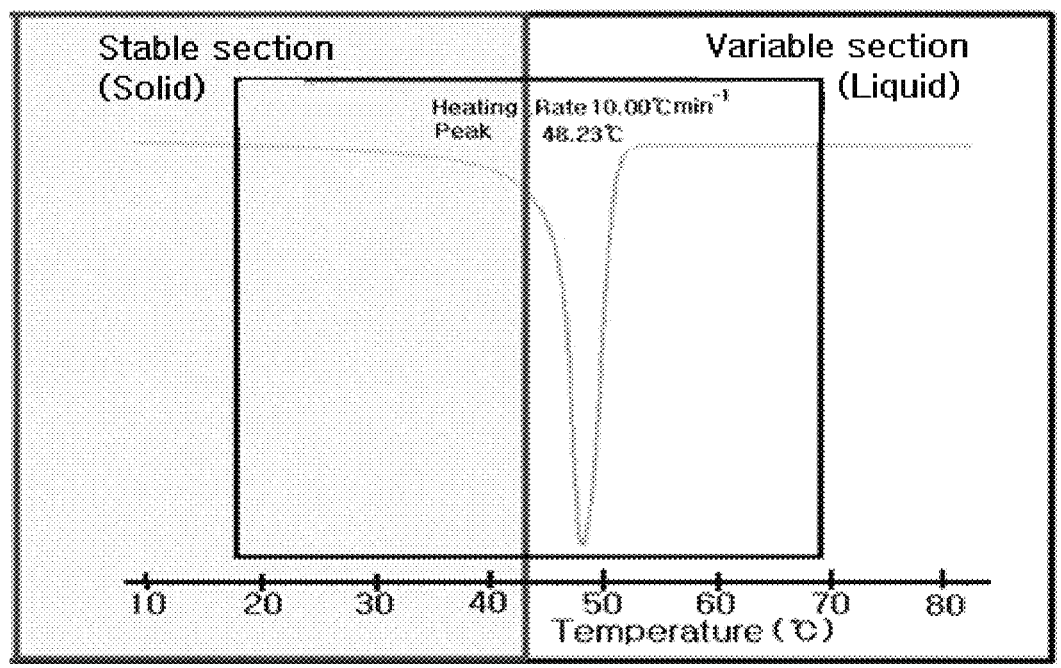

ADHESIVE COMPOSITION, ADHESIVE FILM COMPRISING SAME, BACKPLATE FILM COMPRISING ADHESIVE FILM, AND PLASTIC ORGANIC LIGHT EMITTING DISPLAY COMPRISING ADHESIVE FILM

CROSS-REFERENCE TO RELATED APPLICATION

This application is a national phase entry under 35 U.S.C. § 371 of International Application No. PCT/KR2019/009431 filed Jul. 29, 2019 which claims priority from Korean Patent Application No. 10-2018-0087785, filed with the Korean Intellectual Property Office on Jul. 27, 2018, the entire contents of which are incorporated herein by reference.

TECHNICAL FIELD

The present application relates to an adhesive composition, an adhesive film comprising the same, a backplate film comprising the adhesive film, and a plastic organic light emitting display comprising the adhesive film.

BACKGROUND ART

In the art, an adhesive sheet having high adhesive strength from the beginning of adhesion has been known. In addition, when fixing a base using such an adhesive sheet, an adhesive sheet having sufficient adhesive strength is selected in order to fix the base.

Meanwhile, bubbles generated during a process of bonding the adhesive sheet to the base or unexpected foreign substances may be introduced, which is not preferred in terms of appearance or adhesiveness, and re-adhesion of the adhesive sheet is sometimes required. However, such re-adhesion is difficult in the case of an adhesive sheet with high adhesive strength.

Therefore, technologies reducing such bubbles have been devised. For example, a technology of forming an uneven surface shape on an adhering surface of a pressure-sensitive adhesive using an embossed liner has been devised. In this case, even when the pressure-sensitive adhesive is bonded to the base and bubbles are mixed into the two, air readily flows out through the surface groove of the pressure-sensitive adhesive, and therefore, the bubbles are readily removed without re-adhesion. However, the pressure-sensitive adhesive described above needs to have some thickness in order to form a groove. In addition, when lightly adhering this pressure-sensitive adhesive to a base, the adhered area decreases due to the presence of the groove, and sufficient adhesive strength may not be obtained although work such as rework or position refresh is readily conducted.

In addition, in order to obtain active bending in addition the re-adhesion work, a part of a panel of a plastic organic light emitting diode (POLED) needs to have a process of removing an adhesive sheet, and low adhesive strength is required in order to remove a part the of the adhesive sheet from a substrate during the process.

However, a general adhesive sheet has high adhesive strength after being laminated to an adhered base such as a substrate, and when removing the adhesive sheet, the panel may be damaged, and particularly, a problem of an increase in the adhesive strength occurs when stored for a long period of time even without going through a specific process.

Accordingly, in view of the above, development of an adhesive sheet in which low adhesive strength is maintained at the beginning of adhesion, the adhesive strength is maintained low even after adhesion with a base until a process of removing the adhesive sheet, the adhesive strength is also maintained low even when a temperature is raised to a specific temperature, and sufficient adhesive strength required to fix the base is obtained has been required.

PRIOR ART DOCUMENTS

Patent Documents

Japanese Patent Application Laid-Open Publication No. 2006-299283

DISCLOSURE

Technical Problem

The present application is directed to providing an adhesive composition, an adhesive film comprising the same, a backplate film comprising the adhesive film, and a plastic organic light emitting display comprising the adhesive film.

Technical Solution

One embodiment of the present application provides an adhesive composition comprising a (meth)acrylate-based resin; and a polymer having a melting temperature (Tm) of 53° C. or higher, wherein the polymer is a copolymer of a monofunctional polysiloxane and one type of monomer.

Another embodiment provides an adhesive film comprising a base film; and an adhesive sheet comprising the adhesive composition according to one embodiment of the present application or a cured material thereof provided on one surface of the base film.

Another embodiment provides a backplate film comprising the adhesive film according to the present application; and a protective film provided on the base film side of the adhesive film.

Lastly, one embodiment of the present application provides a plastic organic light emitting display comprising the adhesive film according to the present application; a plastic substrate provided on the adhesive sheet side of the adhesive film; and an organic light emitting layer provided on a surface opposite to the surface in contact with the adhesive film of the plastic substrate.

Advantageous Effects

An adhesive composition according to one embodiment of the present application comprises a polymer having a melting temperature (Tm) of 53° C. or higher and a (meth)acrylate-based resin, and an adhesive sheet comprising the same has low initial adhesive strength with an adhered base.

Particularly, the adhesive sheet included in an adhesive film according to one embodiment of the present application has, while having low initial adhesive strength with an adhered base, adhesive strength maintained constant without increasing even when stored for a long period of time at room temperature, and in particular, adhesive strength is maintained low in a state of raised temperature (50° C.) as well as in a state of room temperature.

Particularly, in order to obtain active bending, a part of a panel of a plastic organic light emitting diode (POLED) needs to have a process of removing an adhesive sheet, and a backplate film comprising the adhesive sheet according to the present application is capable of preventing damages on the panel by having a property of maintaining low initial adhesive strength even in a state of raised temperature (50° C.).

DESCRIPTION OF DRAWINGS

FIG. 1 is a diagram illustrating a schematic lamination structure of an adhesive film according to one embodiment of the present application.

FIG. 2 is a diagram illustrating a schematic lamination structure of a backplate film according to one embodiment of the present application.

FIG. 3 is a diagram illustrating a schematic lamination structure of a plastic organic light emitting display according to one embodiment of the present application.

FIG. 4 is a diagram presenting a DSC graph of a polymer showing a glass transition temperature behavior.

FIG. 5 is a diagram presenting a DSC graph of a polymer showing a melting temperature behavior.

MODE FOR DISCLOSURE

Hereinafter, the present specification will be described in more detail.

In the present specification, a description of a certain part "including" certain constituents means capable of further comprising other constituents, and does not exclude other constituents unless particularly stated on the contrary.

Embodiments of the present disclosure will be described in detail with reference to accompanying drawings so that those skilled in the art may readily implement the present disclosure. However, the present disclosure may be embodied in various different forms, and is not limited to the embodiments described herein.

One embodiment of the present application provides an adhesive composition comprising a (meth)acrylate-based resin; and a polymer having a melting temperature (Tm) of 53° C. or higher, wherein the polymer is a copolymer of a monofunctional polysiloxane and one type of monomer.

The adhesive composition of the present application may comprise a curing agent, and when comprising the curing agent, one embodiment of the present application provides an adhesive composition comprising a (meth)acrylate-based resin; a polymer having a melting temperature (Tm) of 53° C. or higher; and a curing agent, wherein the polymer is a copolymer of a monofunctional polysiloxane and one type of monomer.

The components of the polymer included in the adhesive composition may be identified through a gas chromatography (GC) analysis, and the composition may each be identified through a nuclear magnetic resonance (NMR) analysis.

By the adhesive composition according to one embodiment of the present application comprising a polymer having a melting temperature of 53° C. or higher, adhesive strength of an adhesive sheet prepared later on using the same is maintained low, and particularly, adhesive strength is maintained low in a state of raised temperature (50° C.) as well as in a state of room temperature.

Particularly, in order to obtain active bending, a part of a panel of a plastic organic light emitting diode (POLED) needs to have a process of removing an adhesive sheet, and a backplate film comprising the adhesive sheet according to the present application is capable of preventing damages on the panel by having a property of maintaining low initial adhesive strength even in a state of raised temperature (50° C.)

The adhesive strength being maintained low means that, after laminating the adhesive sheet on an adhered base, there is no difference between adhesive strength at the beginning and adhesive strength after a specific temperature and a specific time.

The melting temperature according to the present application means a temperature at which a material experiences a phase transition from a solid state to a liquid state. Particularly, in the case of a polymer, significant changes in the three-dimensional structure are obtained at a specific temperature as the polymer is heated, and changes corresponding to a phase transition may be observed, and the temperature herein may be defined as a melting temperature.

The melting temperature may be measured using a differential scanning calorimetry (DSC). Specifically, it is a value measured by, after approximately 10 mg of a sample is sealed in a dedicated pan and heated under a constant temperature-raising environment, drawing endothermic and exothermic amounts of the material resulting from the occurrence of a phase transition depending on a temperature.

In the adhesive composition provided in one embodiment of the present application, the monomer is represented by the following Chemical Formula 1.

[Chemical Formula 1]

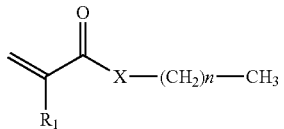

In Chemical Formula 1,
X is N or O,
$R_1$ is hydrogen or a methyl group, and
n is an integer of 10 to 30.

In one embodiment of the present application, n of Chemical Formula 1 may be an integer of 10 to 30.

In another embodiment, n of Chemical Formula 1 may be an integer of 15 to 25.

In another embodiment, n of Chemical Formula 1 may be an integer of 18 to 24.

In one embodiment of the present application, X may be N.

In one embodiment of the present application, X may be O.

In Chemical Formula 1, when the n value is in the above-mentioned range, partial crystallization begins to form due to entanglement between carbon side chains, and as a result, the polymer comprising the same may show a melting temperature (Tm) behavior.

The following FIG. 4 is a DSC graph of a polymer showing a glass transition temperature (Tg) behavior, and the following FIG. 5 is a DSC graph of a polymer showing a melting temperature (Tm) behavior.

As shown in FIG. 4, it is identified that, in a polymer showing a glass transition temperature behavior, a phase transition occurs as a temperature is slowly raised for a stable section (Glassy), and the phase transition (Glassy→Rubbery) slowly occurs in a wide range of temperature section. In other words, when comprising a polymer showing a glass transition temperature behavior, variable characteristics may occur, however, since the phase transition temperature section is wide, a phase transition partially occurs when stored for a long period of time in a state of raised temperature (50° C.), which results in an increase in the adhesive strength of an adhesive layer causing a result of unfavorable stability over time, and variable characteristics may not be superior as well since the phase transition state is a rubbery state.

As shown in FIG. 5 on the other hand, it is seen that, in a polymer showing a melting temperature behavior, a rapid phase transition (solid→liquid) occurs at a specific temperature (melting) when slowly raising a temperature for a stable section (solid). In other words, when comprising a polymer showing a melting temperature behavior, a rapid phase transition occurs at a specific temperature value, which may suppress an increase in the adhesive strength (excellent stability over time) since a phase transition does not occur at a temperature lower than a melting temperature, and at a temperature higher than a melting temperature, a phase transition occurs resulting in a rapid increase in the adhesive strength (excellent variable characteristics).

The polymer having a melting temperature of 53° C. or higher means, when copolymerizing the monofunctional polysiloxane and the one type of monomer represented by Chemical Formula 1, a final polymer having a melting temperature value of 53° C. or higher.

In one embodiment of the present application, the polymer may have a melting temperature of 53° C. or higher, 70° C. or lower, preferably 65° C. or lower, and more preferably 58° C. or lower.

In one embodiment of the present application, the polymer may have a melting temperature of higher than or equal to 53° C. and lower than or equal to 58° C.

The copolymer means a material obtained by polymerizing two or more types of different monomers, and in the copolymer, two or more types of monomers may be irregularly or regularly arranged.

The copolymer may comprise a random copolymer having monomers mixed with each other without order, a block copolymer having arranged blocks repeated by a certain section, or an alternating copolymer having monomers alternately repeated and polymerized, and the polymer having a melting temperature of 53° C. or higher according to one embodiment of the present application may be a random copolymer, a block copolymer or an alternating copolymer.

In one embodiment of the present application, the monomer represented by Chemical Formula 1 may be behenyl methacrylate (BHMA).

As the monofunctional polysiloxane according to the present application, FM-0721 manufactured by Chisso Corporation, KF2012 manufactured by Shin-Etsu Chemical Co., Ltd., or the like may be used, however, the monofunctional polysiloxane is not limited thereto.

In one embodiment of the present application, the polymer having a melting temperature of 53° C. or higher may have a weight average molecular weight of 30,000 g/mol to 200,000 g/mol.

In another embodiment, the polymer having a melting temperature of 53° C. or higher may have a weight average molecular weight of 30,000 g/mol to 150,000 g/mol, and preferably 30,000 g/mol to 100,000 g/mol.

When the polymer having a melting temperature of 53° C. or higher according to the present application has a weight average molecular weight value in the above-mentioned range, molecular arrangements in the polymer are excellent, and properties of low initial adhesive strength are obtained when preparing the adhesive sheet later on.

The weight average molecular weight is one of an average molecular weight in which a molecular weight is not uniform and a molecular weight of a certain polymer material is used as a standard, and is a value obtained by averaging molecular weights of component molecular species of a polymer compound having molecular weight distribution by a weight fraction.

The weight average molecular weight may be measured through a gel permeation chromatography (GPC) analysis.

The polymer having a melting temperature of 53° C. or higher may be prepared comprising a thermal polymerization initiator in a polymer composition comprising the monofunctional polysiloxane; the one type of monomer; and a solvent.

As the solvent, toluene may be used, however, the solvent is not limited thereto as long as it is capable of dissolving the monofunctional polysiloxane and the one type of monomer, and such general organic solvents may be used.

In the adhesive composition provided in one embodiment of the present application, the polymer having a melting temperature of 53° C. or higher comprises, based on 100 parts by weight of the polymer having a melting temperature of 53° C. or higher, the monofunctional polysiloxane in greater than or equal to 10 parts by weight and less than or equal to 40 parts by weight, and the monomer in greater than or equal to 60 parts by weight and less than or equal to 90 parts by weight.

In one embodiment of the present application, the polymer having a melting temperature of 53° C. or higher may comprise, based on 100 parts by weight of the polymer having a melting temperature of 53° C. or higher, the monofunctional polysiloxane in greater than or equal to 10 parts by weight and less than or equal to 40 parts by weight, preferably in greater than or equal to 15 parts by weight and less than or equal to 30 parts by weight, and more preferably in greater than or equal to 18 parts by weight and less than or equal to 25 parts by weight.

In one embodiment of the present application, the polymer having a melting temperature of 53° C. or higher may comprise, based on 100 parts by weight of the polymer having a melting temperature of 53° C. or higher, the monomer in greater than or equal to 60 parts by weight and less than or equal to 90 parts by weight, preferably in greater than or equal to 65 parts by weight and less than or equal to 85 parts by weight, and more preferably in greater than or equal to 70 parts by weight and less than or equal to 85 parts by weight.

When the polymer having a melting temperature of 53° C. or higher according to the present application comprises the monofunctional polysiloxane and the monomer in the above-mentioned parts by weight, the melting temperature value may be properly formed, and accordingly, initial adhesive strength of the adhesive sheet later on at room temperature may be maintained low.

In the adhesive composition provided in one embodiment of the present application, the adhesive composition comprises the polymer having a melting temperature of 53° C. or higher in 1 part by weight to 10 parts by weight based on 100 parts by weight of the (meth)acrylate-based resin.

In another embodiment, the adhesive composition may comprise, based on 100 parts by weight of the (meth)acrylate-based resin, the polymer having a melting temperature of 53° C. or higher in 1 part by weight to 7 parts by weight, and preferably in 2 parts by weight to 6 parts by weight.

When the polymer having a melting temperature of 53° C. or higher is included in the adhesive composition in the above-mentioned parts by weight range, the polymer may be present in a proper amount leading to excellent stability over time in states of both room temperature and raised temperature (50° C.), and as a result, adhesive strength may be maintained constant, and a property of excellent variable performance is obtained in a variable process when used in a plastic organic light emitting display later on.

In one embodiment of the present application, the acrylate-based resin may comprise a (meth)acrylate-based resin having a weight average molecular weight of 100,000 g/mol to 5,000,000 g/mol.

In the present specification, the (meth)acrylate-based resin means comprising both acrylate and methacrylate. Examples of the (meth)acrylate-based resin may comprise a copolymer of a (meth)acrylic acid ester-based monomer and a crosslinking functional group-containing monomer.

The (meth)acrylic acid ester-based monomer is not particularly limited, however, examples thereof may comprise an alkyl (meth)acrylate, and more specifically, as a monomer having an alkyl group with 1 to 12 carbon atoms, one, two or more types among pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate and decyl (meth)acrylate may be included.

The crosslinking functional group-containing monomer is not particularly limited, however, examples thereof may comprise one, two or more types among hydroxy group-containing monomers, carboxyl group-containing monomers and nitrogen-containing monomers.

Examples of the hydroxyl group-containing monomer may comprise 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, 2-hydroxypropylene glycol (meth)acrylate or the like.

Examples of the carboxyl group-containing monomer may comprise (meth)acrylic acid, 2-(meth)acryloyloxyacetic acid, 3-(meth)acryloyloxypropyl acid, 4-(meth)acryloyloxybutyric acid, an acrylic acid dimer, itaconic acid, maleic acid, a maleic anhydride or the like.

Examples of the nitrogen-containing monomer may comprise (meth)acrylonitrile, N-vinyl pyrrolidone, N-vinyl caprolactam or the like.

To the (meth)acrylate-based resin, at least one of vinyl acetate, styrene and acrylonitrile may also be further copolymerized in terms of other functional improvements such as compatibility.

In one embodiment of the present application, the (meth)acrylate-based resin may be selected from the group consisting of alkyl (meth)acrylates, hydroxyalkyl (meth)acrylates and nitrogen-containing monomers.

Examples of the alkyl acrylate and the alkyl methacrylate may comprise, as a monomer having an alkyl group with 1 to 12 carbon atoms, one, two or more types among pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate and decyl (meth)acrylate.

Examples of the hydroxyalkyl acrylate may comprise 2-hydroxyethyl acrylate, 2-hydroxypropyl acrylate, 4-hydroxybutyl acrylate, 6-hydroxyhexyl acrylate, 8-hydroxyoctyl acrylate, 2-hydroxyethylene glycol acrylate, 2-hydroxypropylene glycol acrylate or the like.

Examples of the nitrogen-containing monomer may comprise N-vinyl pyrrolidone (VP).

In one embodiment of the present application, the (meth)acrylate-based resin may comprise, based on 100 parts by weight of the (meth)acrylate-based resin, the alkyl acrylate in parts by weight to 70 parts by weight, the alkyl methacrylate in 5 parts by weight to 40 parts by weight, the nitrogen-containing monomer in 0.1 parts by weight to 10 parts by weight and the hydroxyalkyl acrylate in 1 part by weight to 30 parts by weight.

The (meth)acrylate-based resin comprising the alkyl acrylate in 50 parts by weight to 70 parts by weight, the alkyl methacrylate in 5 parts by weight to 40 parts by weight, the nitrogen-containing monomer in 0.1 parts by weight to 10 parts by weight and the hydroxyalkyl acrylate in 1 to 30 parts by weight means the alkyl acrylate monomer, the alkyl methacrylate monomer, the nitrogen-containing monomer and the hydroxyalkyl acrylate monomer being polymerized in the above-mentioned weight ratio.

In one embodiment of the present application, the (meth)acrylate-based resin may comprise, based on 100 parts by weight of the (meth)acrylate-based resin, the alkyl acrylate in 50 parts by weight to 70 parts by weight, preferably in 55 parts by weight to 70 parts by weight, and more preferably in 60 parts by weight to 70 parts by weight.

In one embodiment of the present application, the (meth)acrylate-based resin may comprise, based on 100 parts by weight of the (meth)acrylate-based resin, the alkyl methacrylate in 5 parts by weight to 40 parts by weight, preferably in 7 parts by weight to 35 parts by weight, and more preferably in 10 parts by weight to 30 parts by weight.

In one embodiment of the present application, the (meth)acrylate-based resin may comprise, based on 100 parts by weight of the (meth)acrylate-based resin, the nitrogen-containing monomer in 0.1 parts by weight to 10 parts by weight, preferably in 1 part by weight to 10 parts by weight, and more preferably in 3 parts by weight to 10 parts by weight.

In one embodiment of the present application, the (meth)acrylate-based resin may comprise, based on 100 parts by weight of the (meth)acrylate-based resin, the hydroxyalkyl acrylate in 1 part by weight to 30 parts by weight, preferably in 5 parts by weight to 25 parts by weight, and more preferably in 5 parts by weight to 20 parts by weight.

When the (meth)acrylate-based resin has the above-mentioned composition and content, properties of excellent variable characteristics of the adhesive sheet are obtained later on.

In one embodiment of the present application, the adhesive composition may further comprise one or more selected from the group consisting of a solvent, a dispersant, a photoinitiator, a thermal initiator and a tackifier.

According to one embodiment of the present specification, the crosslinking compound may comprise one or more types selected from the group consisting of a compound obtained by esterifying a polyalcohol such as hexanediol di(meth)acrylate, ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propylene glycol di(meth)acrylate having 2 to 14 propylene groups, dipentaerythritol penta(meth)acrylate, dipentaerythritol hexa(meth)acrylate or a mixture of an acidic modification of dipentaerythritol penta(meth)acrylate and dipentaerythritol hexa(meth)acrylate (TO-2348, TO-2349 of TOAGOSEI Co., Ltd. as a trade name) with α,β-unsaturated carboxylic acid; a compound obtained by adding (meth)acrylic acid to a compound containing a glycidyl group such as a trimethylolpropane triglycidyl ether acrylic acid adduct or a bisphenol A diglycidyl ether acrylic acid adduct; an ester compound of a compound having a hydroxyl group or an ethylenic unsaturated bond and a polycarboxylic acid, or an adduct with polyisocyanate such as a phthalic acid diester of β-hydroxyethyl(meth)acrylate or a toluene diisocyanate adduct of β-hydroxyethyl (meth) acrylate; a (meth)acrylic acid alkyl ester such as methyl (meth)acrylate, ethyl (meth)acrylate, butyl (meth)acrylate or 2-ethylhexyl (meth)acrylate; and 9,9'-bis[4-(2-acryloyloxyethoxy)phenyl]fluorene. However, the crosslinking compound is not limited thereto, and general compounds known in the art may be used.

According to one embodiment of the present specification, the photoinitiator may be substituted with one, two or more substituents selected from the group consisting of triazine-based compounds, biimidazole compounds, acetophenone-based compounds, O-acyloxime-based compounds, thioxanthone-based compounds, phosphine oxide-based compounds, coumarin-based compounds and benzophenone-based compounds.

Specifically, according to one embodiment of the present specification, the photoinitiator may use a triazine-based compound such as 2,4-trichloromethyl-(4'-methoxyphenyl)-6-triazine, 2,4-trichloromethyl-(4'-methoxystyryl)-6-triazine, 2,4-trichloromethyl-(bifluorenyl)-6-triazine, 2,4-trichloromethyl-(3',4'-dimethoxyphenyl)-6-triazine, 3-{4-[2,4-bis(trichloromethyl)-s-triazin-6-yl]phenylthio}propanoic acid, 2,4-trichloromethyl-(4'-ethylbiphenyl)-6-triazine or 2,4-trichloromethyl-(4'-methylbiphenyl)-6-triazine; a biimidazole-based compound such as 2,2'-bis(2-chlorophenyl)-4,4',5,5'-tetraphenylbiimidazole or 2,2'-bis(2,3-dichlorophenyl)-4,4',5,5'-tetraphenylbiimidazole; an acetophenone-based compound such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propan-1-one (Irgacure-907) or 2-benzyl-2-dimethylamino-1-(4-morpholinophenyl)-butan-1-one (Irgacure-369); an O-acyloxime-based compound such as Irgacure OXE 01 or Irgacure OXE 02 of Ciba Geigy Ltd.; a benzophenone-based compound such as 4,4'-bis(dimethylamino)benzophenone or 4,4'-bis(diethylamino)benzophenone; a thioxanthone-based compound such as 2,4-diethyl thioxanthone, 2-chloro thioxanthone, isopropyl thioxanthone or diisopropyl thioxanthone; a phosphine oxide-based compound such as 2,4,6-trimethylbenzoyl diphenylphosphine oxide, bis(2,6-dimethoxybenzoyl)-2,4,4-trimethylpentyl phosphine oxide or bis(2,6-dichlorobenzoyl)propyl phosphine oxide; a coumarin-based compound such as 3,3'-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin or 10,10'-carbonylbis[1,1,7,7-tetramethyl-2,3,6,7-tetrahydro-1H,5H,11H—Cl]-benzopyrano[6,7,8-ij]-quinolizin-11-one, or the like either alone or as a mixture of two or more, however, the photocuring agent is not limited thereto.

In addition, as the thermal initiator, those known in the art may be used.

As the solvent, toluene may be used, however, the solvent is not limited thereto as long as it is capable of dissolving certain materials, and such general organic solvents may be used.

One embodiment of the present application is directed to providing an adhesive film comprising a base film; and an adhesive sheet comprising the adhesive composition according to one embodiment of the present application or a cured material thereof provided on one surface of the base film.

A lamination structure of the adhesive film may be identified in FIG. 1, and specifically, the adhesive film has a structure in which a base film (101) and an adhesive sheet (102) are consecutively laminated.

In one embodiment of the present application, the adhesive sheet may comprise the adhesive composition according to one embodiment of the present application as it is.

In one embodiment of the present application, the adhesive sheet may comprise a cured material of the adhesive composition according to one embodiment of the present application.

One embodiment of the present application provides an adhesive film further comprising a release film on a surface opposite to the surface in contact with the base film of the adhesive sheet.

The release film refers to, as a layer for protecting a very thin adhesive sheet, a transparent layer attached on one surface of the adhesive sheet, and a hydrophobic film may be used, and films having excellent mechanical strength, thermal stability, moisture shielding property, isotropy and the like may be used. For example, resin films of acetate-based such as triacetyl cellulose (TAC), polyester-based, polyethersulphone-based, polycarbonate-based, polyamide-based, polyimide-based, polyolefin-based, cycloolefin-based, polyurethane-based, acryl-based and the like may be used, however, the release film is not limited thereto as long as it is a commercially available silicone-treated release film.

In one embodiment of the present application, the base film may be selected from the group consisting of polyethylene terephthalate (PET), polyester, polycarbonate, polyimide (PI), polyethylene naphthalate (PEN), polyether ether ketone (PEEK), polyarylate (PAR), polycyclic olefin (PCO), polynorbornene, polyethersulphone (PES) and a cycloolefin polymer (COP).

In another embodiment, the base film may be polyethylene terephthalate (PET).

In one embodiment of the present application, the base film may have a thickness of greater than or equal to 10 μm and less than or equal to 200 μm, preferably greater than or equal to 15 μm and less than or equal to 100 μm, and more preferably greater than or equal to 20 μm and less than or equal to 75 μm.

In addition, the base film is preferably transparent. The meaning of the base film being transparent described herein represents light transmittance of visible light (400 nm to 700 nm) being 80% or higher.

When the base film has a thickness in the above-mentioned range, the laminated adhesive film may be prepared to a thin film.

In one embodiment of the present application, the adhesive sheet may have a thickness of greater than or equal to 3 μm and less than or equal to 100 μm.

In another embodiment, the adhesive sheet may have a thickness of greater than or equal to 3 μm and less than or equal to 100 μm, preferably greater than or equal to 5 μm and less than or equal to 80 μm, and more preferably greater than or equal to 10 μm and less than or equal to 50 μm.

When the adhesive sheet has a thickness in the above-mentioned range, rework properties are superior when incorrectly attached, and particularly, no foreign substances remain when removing the adhesive sheet.

In the adhesive film provided in one embodiment of the present application, the adhesive film has a thickness of greater than or equal to 50 μm and less than or equal to 300 μm.

In another embodiment, the adhesive film may have a thickness of greater than or equal to 50 μm and less than or equal to 300 μm, preferably greater than or equal to 50 μm and less than or equal to 250 μm, and more preferably greater than or equal to 55 µm and less than or equal to 250 µm. By the adhesive film having a thickness in the above-mentioned range, a proper thickness as a back plate is obtained when used in a plastic organic light emitting display later on, and in addition thereto, rework properties are superior when incorrectly attached, and particularly, no foreign substances remain when removing the adhesive sheet.

One embodiment of the present application provides an adhesive film in which, after bonding the surface opposite to the surface in contact with the base film of the adhesive sheet with stainless (SUS304 substrate),
- initial adhesive strength after leaving unattended for 2 hours at 23° C. is 50 gf/inch or less,
- middle adhesive strength after leaving unattended for 24 hours at 23° C. is 55 gf/inch or less, and
- late adhesive strength after leaving unattended for 24 hours at 50° C. is 60 gf/inch or less.

The initial adhesive strength, the middle adhesive strength and the late adhesive strength are each measured using a texture analyzer (Stable Micro Systems) at a 180° angle and a peeling rate of 1800 mm/minute, and after attaching the adhesive sheet prepared according to the present disclosure to stainless (304 substrate) using a 2 kg rubber roller going back and forth once.

In another embodiment, initial adhesive strength after leaving unattended for 2 hours at 23° C. after bonding the surface opposite to the surface in contact with the base film of the adhesive sheet with stainless (SUS304 substrate) may be 50 gf/inch or less, preferably 45 gf/inch or less, and more preferably 43 gf/inch or less.

In another embodiment, initial adhesive strength after leaving unattended for 2 hours at 23° C. after bonding the surface opposite to the surface in contact with the base film of the adhesive sheet with stainless (SUS304 substrate) may be 5 gf/inch or greater, preferably 10 gf/inch or greater, and more preferably 25 gf/inch or greater.

In another embodiment, middle adhesive strength after leaving unattended for 24 hours at 23° C. after bonding the surface opposite to the surface in contact with the base film of the adhesive sheet with stainless (SUS304 substrate) may be 55 gf/inch or less, preferably 50 gf/inch or less, and more preferably 45 gf/inch or less.

In another embodiment, middle adhesive strength after leaving unattended for 24 hours at 23° C. after bonding the surface opposite to the surface in contact with the base film of the adhesive sheet with stainless (SUS304 substrate) may be 10 gf/inch or greater, preferably 15 gf/inch or greater, and more preferably 30 gf/inch or greater.

In another embodiment, late adhesive strength after leaving unattended for 24 hours at 50° C. after bonding the surface opposite to the surface in contact with the base film of the adhesive sheet with stainless (SUS304 substrate) may be 60 gf/inch or less, preferably 55 gf/inch or less, and more preferably 50 gf/inch or less.

In another embodiment, late adhesive strength after leaving unattended for 24 hours at 50° C. after bonding the surface opposite to the surface in contact with the base film of the adhesive sheet with stainless (SUS304 substrate) may be 15 gf/inch or greater, preferably 20 gf/inch or greater, and more preferably 30 gf/inch or greater.

By the adhesive sheet according to the present application comprising the polymer having a melting temperature of 53° C. or higher as described above, adhesive strength is maintained at a low level after leaving unattended for 2 hours/ leaving unattended for 24 hours at room temperature (23° C.), and particularly, adhesive strength is maintained constant at a low level even after leaving unattended for 24 hours in a state of raised temperature (50° C.).

One embodiment of the present application provides an adhesive film in which the late adhesive strength/the initial adhesive strength is greater than or equal to 0.3 and less than or equal to 2.0.

In another embodiment, the late adhesive strength/the initial adhesive strength may be greater than or equal to 0.3 and less than or equal to 2.0, preferably greater than or equal to 0.6 and less than or equal to 1.5, and more preferably greater than or equal to 0.9 and less than or equal to 1.3.

In one embodiment of the present application, the adhesive sheet and the base film may be laminated in plurality.

In the present application, the adhesive film may be prepared by coating the adhesive composition on the base film using a bar coater.

One embodiment of the present application provides a backplate film comprising the adhesive film according to the present application; and a protective film provided on the base film side of the adhesive film.

One embodiment of the present application is directed to providing a backplate film comprising the adhesive film according to the present application; and a protective film provided on one surface of the adhesive film, wherein the adhesive film is formed with a base film and an adhesive sheet, and the protective film is provided on a surface opposite to the surface in contact with the adhesive sheet of the base film.

A lamination structure of the backplate film may be identified in FIG. 2. Specifically, the backplate film has a lamination structure of an adhesive film (103) and a protective film (104), and more specifically, the adhesive film (103) is formed with a base film (101) and an adhesive sheet (102), and one surface of the base film (101) is bonded to the protective film (104) in the backplate film (105).

In the backplate film, the protective film performs a role of protecting the adhesive film when transferring the backplate film or conducting the process, and the protective film may be removed when using the backplate film in a plastic organic light emitting display later on.

In one embodiment of the present application, the protective film may be formed with a protective base; and an adhesive layer.

As the protective base, an identical material may be used as the base film.

The adhesive layer is not limited thereto as long as it is capable of adhering the protective base and the base film, and commercially available general adhesive layers may be used.

One embodiment of the present application provides a plastic organic light emitting display comprising the adhesive film according to the present application; a plastic substrate provided on the adhesive sheet side of the adhesive film; and an organic light emitting layer provided on a surface opposite to the surface in contact with the adhesive film of the plastic substrate.

One embodiment of the present application is directed to providing a plastic organic light emitting display comprising the adhesive film according to the present application; a plastic substrate provided on one surface of the adhesive film; and an organic light emitting layer provided on a surface opposite to the surface in contact with the adhesive film of the plastic substrate, wherein the adhesive film is formed with a base film and an adhesive sheet, and the plastic substrate is provided on a surface opposite to the surface in contact with the base film of the adhesive film.

One embodiment of the present application provides a plastic organic light emitting display comprising a protective film provided on the base film side of the adhesive film.

A lamination structure of the plastic organic light emitting display may be identified in FIG. 3. Specifically, the plastic organic light emitting display has a lamination structure of a protective film (104); an adhesive film (103); a plastic substrate (106); and an organic light emitting layer (107), and more specifically, a lamination structure of the plastic organic light emitting display in which the adhesive sheet (102) of the adhesive film (103) and the plastic substrate (106) are bonded may be identified.

In the lamination structure of the plastic organic light emitting display, the protective film may be removed.

As the plastic substrate, polyimide (PI) may be used.

The organic light emitting layer may be selected from the group consisting of an organic photoelectric device, an organic transistor, an organic solar cell, an organic light emitting device and a micro LED device.

Hereinafter, the present disclosure will be described in detail with reference to examples so that those skilled in the art may readily implement the present disclosure. However, the present disclosure may be embodied in various different forms, and is not limited to the examples described herein.

PREPARATION EXAMPLE

<Preparation Example 1> Polymerization of (Meth)acrylate-Based Resin

After introducing ethylhexyl acrylate (EHA)/methyl methacrylate (MMA)/N-vinylpyrrolidone (VP)/hydroxyethyl acrylate (HEA) to ethyl acetate (EA) in a weight ratio of 65/20/5/10, azobisisobutyronitrile (AIBN), a thermal polymerization initiator, was introduced thereto to prepare a (meth)acrylate-based resin having a weight average molecular weight of 1,000,000 g/mol.

<Preparation Example 2> Polymerization of Polymer

A polymer having a composition and a melting temperature of the following Table 1 was prepared.

TABLE 1

|  | Preparation 1 | Preparation 2 | Preparation 3 |
|---|---|---|---|
| Composition (Content) | FM0721:BHMA (20:80) | FM0721:BHMA (20:80) | FM0721:HAD (20:80) |
| Molecular Weight (g/mol) | 60,000 | 60,000 | 60,000 |
| Melting Temperature (Tm, ° C.) | 55 | 55 | 36 |

In Table 1, FM0721 is a monofunctional polysiloxane and a product of Chisso Corporation was used, and the FM0721 is polysiloxane-present (meth)acrylate.

BHMA and HDA monomers used in Preparations 1 to 3 are monomers having only a Tm property when polymerized, and do not exhibit a Tg property.

In Table 1, BHMA is behenyl methacrylate, and HDA is hexadecyl acrylate.

<Example>—Manufacture of Backplate Film

Example 1

With respect to 100 parts by weight of the (meth)acrylate-based resin prepared in Preparation Example 1, 1 part by weight of an isocyanate crosslinking agent (Samyoung Ink&Paint Industrial, Co., Ltd., DR7030HD) was added, and after adding 3 parts by weight of the polymer of Preparation 1 polymerized in Preparation Example 2 thereto, an adhesive composition was prepared to have a solid content of 20% using a toluene solution.

On a PET film (T9145J75) of Mitsubishi Plastics Inc. (MPI) having both surfaces anti-static (AS) treated, the adhesive composition of Example 1 was coated to prepare an adhesive sheet to a thickness of 15 μm, then PET (RF12ASW) having both surfaces anti-static (AS) treated was coated on the PET film as a protective film, and the result was aged for 2 days at 40° C. to manufacture a backplate film.

Example 2

With respect to 100 parts by weight of the (meth)acrylate-based resin prepared in Preparation Example 1, 1 part by weight of an isocyanate crosslinking agent (Samyoung Ink&Paint Industrial, Co., Ltd., DR7030HD) was added, and after adding 5 parts by weight of the polymer of Preparation 2 polymerized in Preparation Example 2 thereto, an adhesive composition was prepared to have a solid content of 20% using a toluene solution.

On a PET film (T9145J75) of Mitsubishi Plastics Inc. (MPI) having both surfaces anti-static (AS) treated, the adhesive composition of Example 2 was coated to prepare an adhesive sheet to a thickness of 15 μm, then PET (RF12ASW) having both surfaces anti-static (AS) treated was coated on the PET film as a protective film, and the result was aged for 2 days at 40° C. to manufacture a backplate film.

Comparative Example 1

With respect to 100 parts by weight of the (meth)acrylate-based resin prepared in Preparation Example 1, 1 part by weight of an isocyanate crosslinking agent (Samyoung Ink&Paint Industrial, Co., Ltd., DR7030HD) was added, and then an adhesive composition was prepared to have a solid content of 20% using a toluene solution.

On a PET film (T9145J75) of Mitsubishi Plastics Inc. (MPI) having both surfaces anti-static (AS) treated, the adhesive composition of Comparative Example 1 was coated to prepare an adhesive sheet to a thickness of 15 μm, then PET (RF12ASW) having both surfaces anti-static (AS) treated was coated on the PET film as a protective film, and the result was aged for 2 days at 40° C. to manufacture a backplate film.

Comparative Example 2

With respect to 100 parts by weight of the (meth)acrylate-based resin prepared in Preparation Example 1, 1 part by weight of an isocyanate crosslinking agent (Samyoung Ink&Paint Industrial, Co., Ltd., DR7030HD) was added, and after adding 3 parts by weight of the polymer of Preparation 3 polymerized in Preparation Example 2 thereto, an adhesive composition was prepared to have a solid content of 20% using a toluene solution.

On a PET film (T9145J75) of Mitsubishi Plastics Inc. (MPI) having both surfaces anti-static (AS) treated, the adhesive composition of Comparative Example 2 was coated to prepare an adhesive sheet to a thickness of 15 μm, then PET (RF12ASW) having both surfaces anti-static (AS)

treated was coated on the PET film as a protective film, and the result was aged for 2 days at 40° C. to manufacture a backplate film.

The T9145J75 is an adhesive-coated base film, and the RF12ASW may be expressed as a release film.

Adhesive strength after laminating the adhesive sheet of one of the backplate films manufactured in Example 1, Example 2, Comparative Example 1 and Comparative Example 2 with stainless (SUS substrate) was measured, and the measurement details are described in the following Table 2. Herein, when a stick & slip phenomenon occurred in the adhesive strength, an average value of the maximum value was recorded, and when a stick & slip phenomenon did not occur, an average value was recorded.

TABLE 2

|  | Example 1 | Example 2 | Comparative Example 1 | Comparative Example 2 |
|---|---|---|---|---|
| Initial Adhesive Strength (gf/in) | 41 | 33 | 1754 | 35 |
| Middle Adhesive Strength (gf/in) | 44 | 38 | 1810 | 38 |
| Late Adhesive Strength (gf/in) | 50 | 35 | 1901 | 1840 |

1. Initial adhesive strength: the adhesive sheet of one of the backplate films manufactured in Example 1, Example 2, Comparative Example 1 and Comparative Example 2 was laminated with stainless (SUS substrate) using a 2 kg rubber roller going back and forth once, and after leaving the result unattended for 2 hours at 23° C., adhesive strength was measured by peeling the backplate film from the stainless (SUS substrate) at a 180° angle and a peeling rate of 1800 mm/minute using a texture analyzer.
2. Middle adhesive strength: the adhesive sheet of one of the backplate films manufactured in Example 1, Example 2, Comparative Example 1 and Comparative Example 2 was laminated with stainless (SUS substrate) using a 2 kg rubber roller going back and forth once, and after leaving the result unattended for 24 hours at 23° C., adhesive strength was measured by peeling the backplate film from the stainless (SUS substrate) at a 180° angle and a peeling rate of 1800 mm/minute using a texture analyzer.
3. Late adhesive strength: the adhesive sheet of one of the backplate films manufactured in Example 1, Example 2, Comparative Example 1 and Comparative Example 2 was laminated with stainless (SUS substrate) using a 2 kg rubber roller going back and forth once, and after leaving the result unattended for 24 hours at 50° C., adhesive strength was measured by peeling the backplate film from the stainless (SUS substrate) at a 180° angle and a peeling rate of 1800 mm/minute using a texture analyzer.

As identified in Table 2, the adhesive sheet comprising the adhesive composition of the present application had low initial adhesive strength by comprising a polymer having a melting temperature (Tm) of 53° C. or higher and a (meth)acrylate-based resin. Particularly, as identified in Example 1 and Example 2, it was identified that initial adhesive strength was maintained very low compared to Comparative Example 1 and Comparative Example 2. Comparative Example 1 was a case of not using the polymer according to the present application as the adhesive sheet, and Comparative Example 2 is a case of using an adhesive sheet having a melting temperature of 36° C. as the adhesive sheet.

In addition, Example 1 and Example 2 included the polymer having a melting temperature of 53° C. or higher in 1 part by weight to 10 parts by weight with respect to 100 parts by weight of the (meth)acrylate-based resin, and had an excellent property of maintaining low adhesive strength at a specific temperature, and when not further comprising the (meth)acrylate-based resin, the adhesive sheet was not formed.

Particularly, it was identified that the adhesive sheet of the adhesive film according to one embodiment of the present application (Example 1 and Example 2) had, while having low initial adhesive strength, adhesive strength maintained constant without increasing even when stored for a long period of time at room temperature compared to Comparative Example 1 and Comparative Example 2, and particularly, adhesive strength was maintained low in a state of raised temperature (50° C.) as well as in a state of room temperature. This was characteristics obtained by comprising the polymer showing a Tm behavior in the adhesive sheet, and it was identified that stability over time was excellent compared to when comprising the Tg-type polymer.

Particularly, in order to obtain active bending, a part of a panel of a plastic organic light emitting diode (POLED) needs to have a process of removing an adhesive sheet, and the backplate film comprising the adhesive sheet according to the present application is capable of preventing damages on the panel by having a property of maintaining low initial adhesive strength even in a state of raised temperature (50° C.), and it was identified that the backplate film according to the present application was suited.

REFERENCE NUMERAL

101: Base Film
102: Adhesive Sheet
103: Adhesive Film
104: Protective Film
105: Backplate Film
106: Plastic Substrate
107: Organic Light Emitting Layer

The invention claimed is:

1. An adhesive composition comprising:
a (meth)acrylate-based resin; and
a polymer having a melting temperature (Tm) of 53° C. or higher,
wherein the polymer is a copolymer of a monofunctional polysiloxane and a monomer,
wherein the (meth)acrylate-based resin comprises 50 parts by weight to 70 parts by weight of an alkyl acrylate, 5 parts by weight to 40 parts by weight of an alkyl methacrylate, 0.1 parts by weight to 10 parts by weight of a nitrogen-containing monomer, and 1 part by weight to 30 parts by weight of a hydroxyalkyl acrylate,
wherein the monofunctional polysiloxane is included in an amount of greater than or equal to 10 parts by weight and less than or equal to 40 parts by weight, and the monomer is included in an amount of greater than or equal to 60 parts by weight and less than or equal to 90 parts by weight, based on 100 parts by weight of the polymer,
wherein the polymer is included in an amount of 1 part by weight to 10 parts by weight, based on 100 parts by weight of the (meth)acrylate-based resin, and wherein the monomer is represented by Chemical Formula 1:

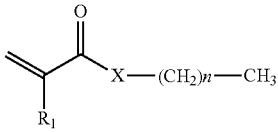

[Chemical Formula 1]

wherein, in Chemical Formula 1,
X is N or O;
R1 is hydrogen or a methyl group; and
n is an integer of 16 to 24.

2. The adhesive composition of claim 1, wherein the monomer represented by Chemical Formula 1 is behenyl methacrylate (BHMA).

3. The adhesive composition of claim 1, further comprising one or more of a solvent, a dispersant, a photoinitiator, a thermal initiator or a tackifier.

4. An adhesive film comprising:
a base film; and
an adhesive sheet comprising the adhesive composition of claim 1 or a cured material thereof provided on a surface of the base film.

5. The adhesive film of claim 4, further comprising a release film on a surface of the adhesive sheet, which is opposite to the surface in contact with the base film.

6. The adhesive film of claim 4, wherein, after bonding a surface opposite to the surface in contact with the base film of the adhesive sheet with stainless steel (SUS304 substrate), the adhesive sheet has:
an initial adhesive strength after leaving unattended for 2 hours at 23° C. of 50 gf/inch or less;
a middle adhesive strength after leaving unattended for 24 hours at 23° C. of 55 gf/inch or less; and
a late adhesive strength after leaving unattended for 24 hours at 50° C. of 60 gf/inch or less.

7. The adhesive film of claim 6, wherein the late adhesive strength/the initial adhesive strength is greater than or equal to 0.3 and less than or equal to 2.0.

8. The adhesive film of claim 4, wherein the adhesive sheet has a thickness of greater than or equal to 3 µm and less than or equal to 100 µm.

9. The adhesive film of claim 4, wherein the adhesive film has a thickness of greater than or equal to 50 µm and less than or equal to 300 µm.

10. A backplate film comprising:
the adhesive film of claim 4; and
a protective film provided on the base film of the adhesive film.

11. A plastic organic light emitting display comprising:
the adhesive film of claim 4;
a plastic substrate provided on the adhesive sheet of the adhesive film; and
an organic light emitting layer provided on a surface of the plastic substrate, which is opposite to the surface in contact with the adhesive film.

12. The plastic organic light emitting display of claim 11, further comprising a protective film provided on the base film of the adhesive film.

* * * * *